(12) United States Patent
Huang et al.

(10) Patent No.: US 7,986,007 B2
(45) Date of Patent: Jul. 26, 2011

(54) MOS TRANSISTOR AND MANUFACTURING METHOD THEREOF

(75) Inventors: Kai-Yi Huang, Taipei (TW); Ta-Hsun Yeh, Hsin-Chu (TW); Yuh-Sheng Jean, Yun-Lin Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/056,293

(22) Filed: Mar. 27, 2008

(65) Prior Publication Data

US 2008/0251841 A1 Oct. 16, 2008

(30) Foreign Application Priority Data

Apr. 12, 2007 (TW) .............................. 96112832 A

(51) Int. Cl.
*H01L 27/12* (2006.01)
(52) U.S. Cl. ........ 257/350; 257/351; 257/358; 257/360; 257/363; 257/516; 257/543; 257/E51.003
(58) Field of Classification Search .................. 257/350, 257/351, 358, 360, 363, 379, 516, 543, E51.003
See application file for complete search history.

(56) References Cited

U.S. PATENT DOCUMENTS

| | | | |
|---|---|---|---|
| 5,293,058 A | 3/1994 | Tsividis | |
| 5,627,394 A | 5/1997 | Chang et al. | |
| 5,955,911 A | 9/1999 | Drost et al. | |
| 6,051,856 A | 4/2000 | McKay et al. | |
| 6,218,251 B1 | 4/2001 | Kadosh et al. | |
| 6,313,687 B1 | 11/2001 | Banu | |
| 6,356,154 B1 | 3/2002 | Hallen | |
| 6,504,416 B1 | 1/2003 | Mariani | |
| 7,009,265 B2 | 3/2006 | Anderson et al. | |
| 2006/0001060 A1* | 1/2006 | Rhodes | 257/292 |
| 2006/0040450 A1* | 2/2006 | Hsu | 438/305 |

OTHER PUBLICATIONS

China Office Action dated May 11, 2010.

* cited by examiner

*Primary Examiner* — Tan N Tran
(74) *Attorney, Agent, or Firm* — Thomas, Kayden, Horstemeyer & Risley, LLP

(57) ABSTRACT

The structure of the MOS transistor provided in this invention has LDD (lightly doped drain) and halo doped regions removed from the source, the drain or both regions in the substrate for improved linearity range when operated as a voltage-controlled resistor. The removal of the LDD and halo doped regions is performed by simply modifying the standard mask of the MOS process using a logic operation layer with no extra mask required.

20 Claims, 9 Drawing Sheets

MOS TRANSISTOR AND MANUFACTURING METHOD THEREOF

BACKGROUND OF THE INVENTION

1. Field of the Invention

The present invention relates to a MOS transistor and a MOS transistor manufacturing method, and more particularly, to a MOS transistor having a wider resistor linearity range and the manufacturing method thereof.

2. Description of the Prior Art

A voltage-controlled resistor is an element whose resistance can be changed with an input control signal and is widely applied in a variety of integrated circuits such as tuning circuits. In general, when the relationship between a current value of the current flowing through a resistor and a voltage drop between two ends of the resistor is linear, the resistor is regarded as a resistor of good characteristic. In other words, when the resistance stays constant in an operation region, the resistor is regarded as a resistor of good characteristic. When a MOS transistor, namely a metal oxide semiconductor field effect transistor (MOSFET), operates in a triode region, the relationship between the drain-to-source current Ids and the drain-to-source voltage Vds is linear, and it is usually used as a voltage-controlled resistor. However, when the MOS transistor is used as a voltage-controlled resistor, its operation range is restricted. Relevant descriptions are as follows.

Please refer to FIG. 1. FIG. 1 is a schematic diagram illustrating a structure of an N-type MOSFET produced using a standard process. The typical N-type MOSFET includes a substrate 100, a gate 120 located on the substrate 100, two N-type source/drain doped regions 104 located in the substrate 100 and set at two sides of the gate 120, and spacers 160 disposed over two sides of the gate 120. In addition, a lightly doped drain (LDD) 106 and a halo doped region 108 are arranged in the substrate 100 below two sides of the gate 120 respectively.

The drain-to-source current Ids of the N-type MOSFET can be represented by the following equation:

$$Ids = \mu Cox \frac{W}{L}\left[(Vgs - Vth)Vds' - \frac{1}{2}Vds'^2\right] \quad (1)$$

Although a small voltage drop between the two sides of the LDD 106 is induced through the existence of the LDD 106, Vds'≅Vds can be assumed since the voltage drop is negligible. When Vds<<2(Vgs−Vth) (i.e. a MOSFET operates in a triode region), the above equation (1) can be rewritten as shown below:

$$Ids \cong \mu Cox \frac{W}{L}[(Vgs - Vth)Vds] \quad (2)$$

If the path from the source to the drain serves as a resistor, the relationship between the drain-to-source current Ids and drain-to-source voltage Vds is linear, and the resistance can be represented by the following equation:

$$Rout = \frac{1}{\mu C_{ox}\frac{W}{L}(V_{gs} - V_{th})} \quad (3)$$

In light of equation (3), it is observed that the typical MOSFET can be used as a voltage-controlled resistor because the resistance between the source and the drain can be controlled easily by adjusting the gate voltage.

However, in order to keep the resistance between the source and the drain of the typical MOSFET constant, the operation range of the drain-to-source voltage Vds is very narrow. Once the voltage value of the drain-to-source voltage Vds gets too high, the MOSFET will leave the triode region, and the resistance between the source and the drain will no longer remain constant. Therefore, the characteristic of the whole circuit will be affected. For example, when an input AC signal swings over the operation range of the drain-to-source voltage Vds, signal distortion or signal skew of the input signal will arise.

SUMMARY OF THE INVENTION

It is therefore one of the objectives of the present invention to provide a MOS transistor and a related MOS transistor manufacturing method capable of expanding the linear resistor operation range of the voltage-controlled resistor.

According to an exemplary embodiment of the present invention, a structure of a MOS transistor is disclosed. The structure of the MOS transistor comprises: a gate; a substrate having a channel region, a first electrode region and a second electrode region, in which the channel region is located below the gate, and the first electrode region and the second electrode region are set at two sides of the channel region respectively; a first doped region that is set in the first electrode region; and a second doped region that is set in the second electrode region. The first doped region and the channel region are separated by a first separated region, the second doped region and the channel region are separated by a second separated region, and at most only the first separated region or the second separated region comprises a lightly doped drain (LDD).

According to an exemplary embodiment of the present invention, a MOS transistor manufacturing method is also disclosed. The method comprises: providing a substrate having a channel region, a first electrode region and a second electrode region, where the first electrode region and the second electrode region are set at two sides of the channel region respectively; forming a gate above the substrate, wherein the gate is located above the channel region; forming a first doped region in the first electrode region, wherein the first doped region and the channel region are separated by a first separated region; forming a second doped region in the second electrode region, wherein the second doped region and the channel region are separated by a second separated region; and forming a lightly doped drain in at most only the first separated region or the second separated region.

According to another exemplary embodiment of the present invention, a MOS transistor serving as a voltage-controlled resistor is disclosed. The MOS transistor comprises: a gate; a source set at a first side of the gate; and a drain set at a second side of the gate. The source and the gate are separated by a first separated region, the drain and the gate are separated by a second separated region, and the MOS transistor is an asymmetric MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
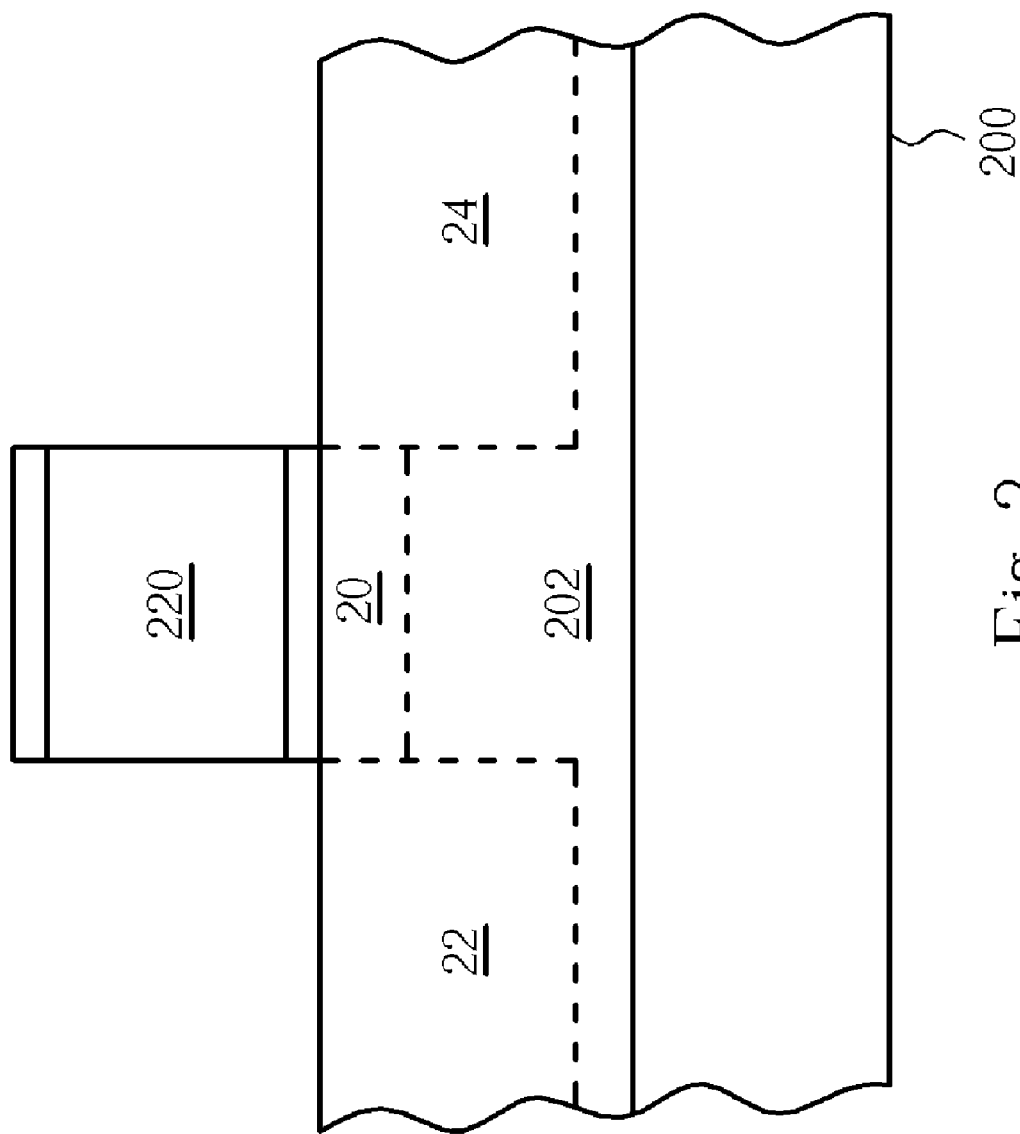
FIG. 2 to FIG. 6 are cross-sectional diagrams of a MOS transistor manufactured during a semiconductor process according to an embodiment of the present invention.

Please refer to FIG. 2 to FIG. 6, which are cross-sectional diagrams of a MOS transistor manufactured according to an embodiment of the present invention. As shown in FIG. 2, a substrate 200 is provided, and the substrate 200 includes a channel region 20, a first electrode region 22 and a second electrode region 24. The channel region 20, the first electrode region 22 and the second electrode region 24 are used to define the relative positions in the structure of the MOS transistor. However, regions defined here may represent corresponding regions in other figures that are not marked. They are neglected in other figures for the sake of clarity and simplicity. The first electrode region 22 and the second electrode region 24 are set at two sides of the channel region 20 respectively, and a doped well 202 is formed in the substrate 200. In this embodiment, if the MOS transistor is an N-type MOS transistor, the doped well 202 is a P-well; on the other hand, if the MOS transistor is a P-type MOS transistor, the doped well 202 is an N-well. Next, a gate 220 is fabricated on the substrate 200 and above the channel region 20.

Figure 3:
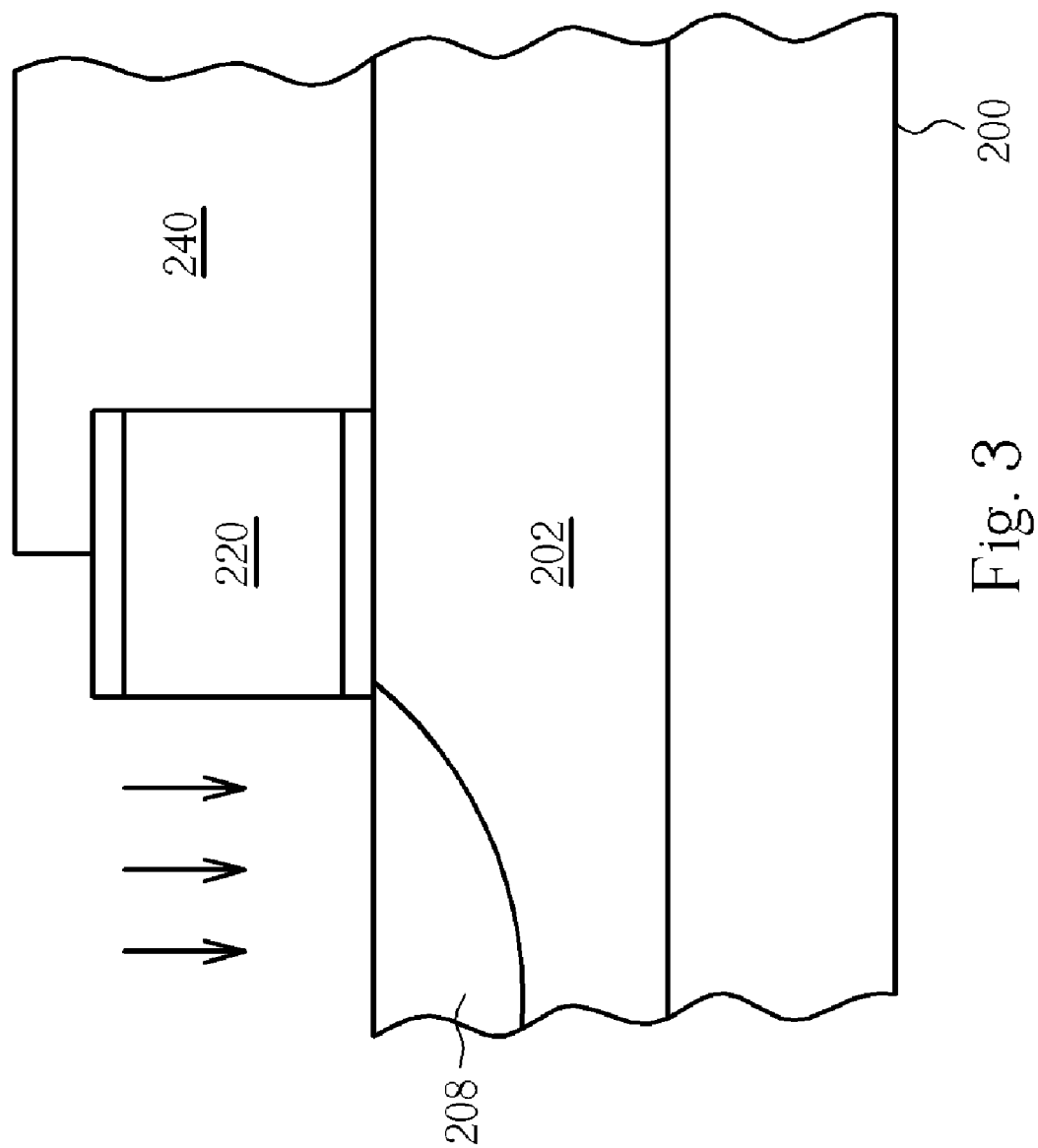
Figure 4:
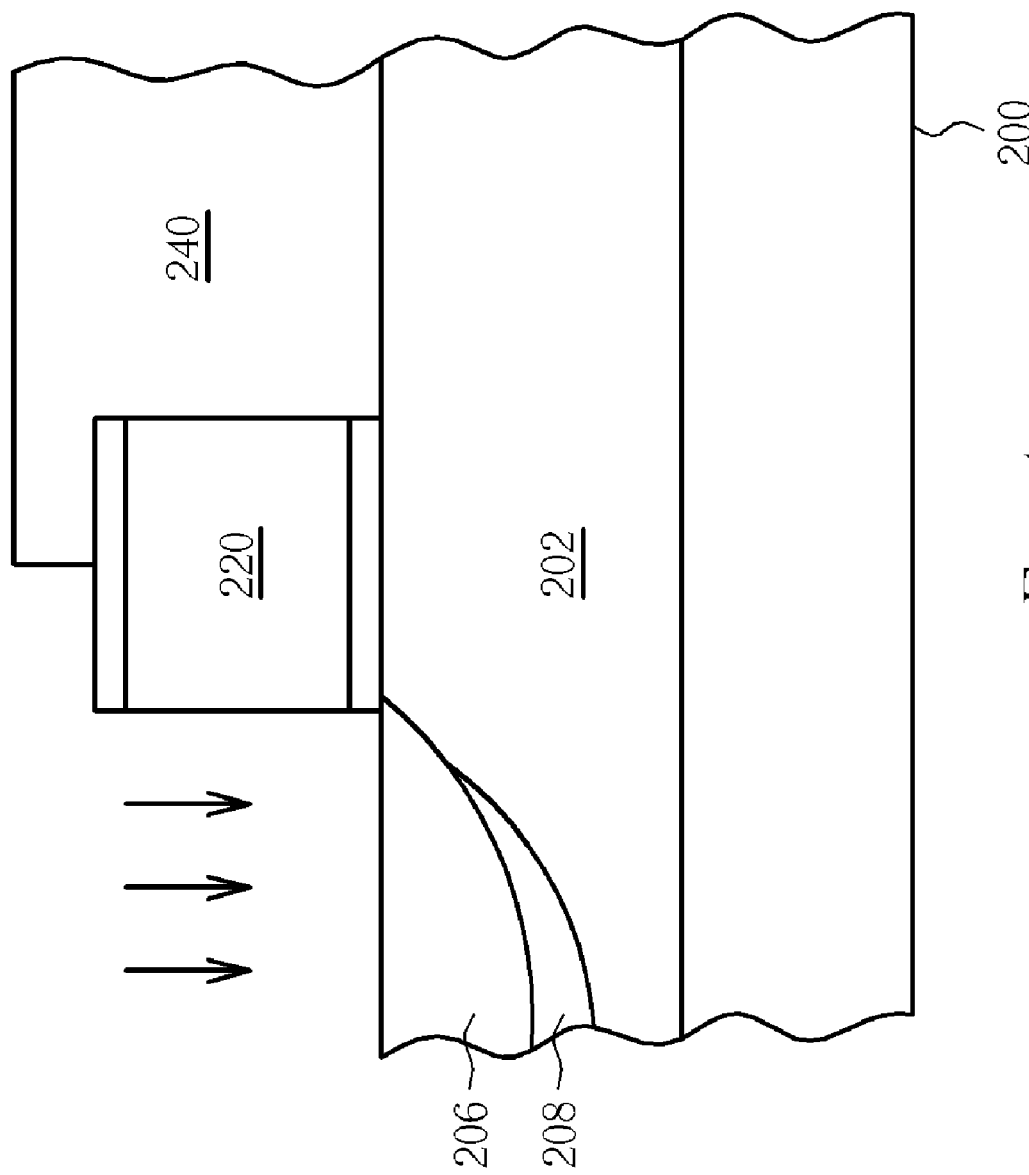

As shown in FIG. 3 and FIG. 4, a photo mask that complies with a standard process is modified through a logic operation layer. In this way, a modified mask can be used to set a mask layer 240 (e.g. a photo resist layer) for masking the surface of the second electrode region 24 in the substrate 200. A halo implantation process is then performed on the exposed surface of the first electrode region 22 in the substrate 200 in order to form a halo doped region 208 in the first electrode region 22 of the substrate 200. However, no halo region is formed in the second electrode region 24 of the substrate 200. Afterwards, an ion implantation process is performed in order to form an LDD 206 in the first electrode region 22; however, no LDD is formed in the second electrode region 24.

Figure 5:
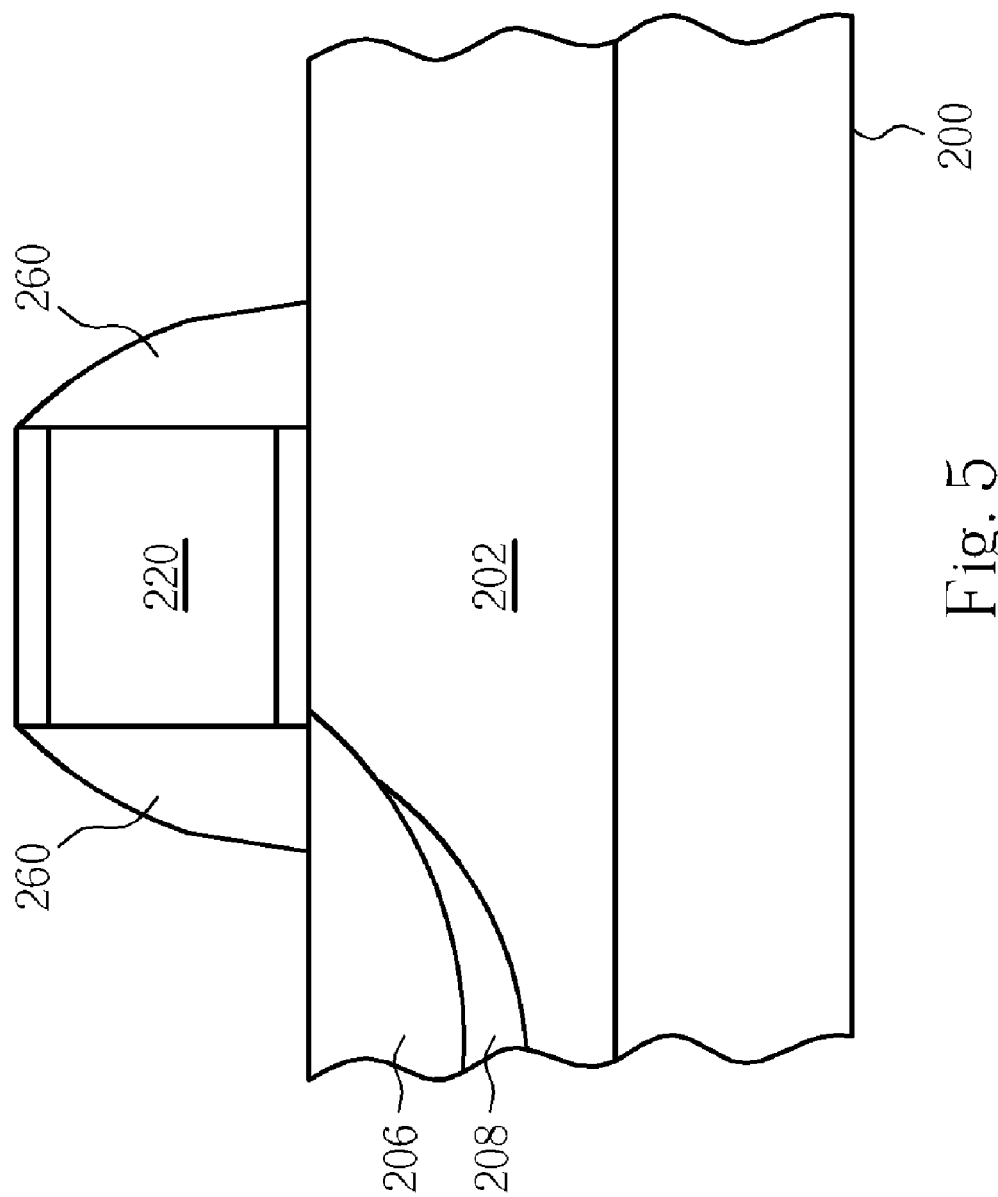
Figure 6:
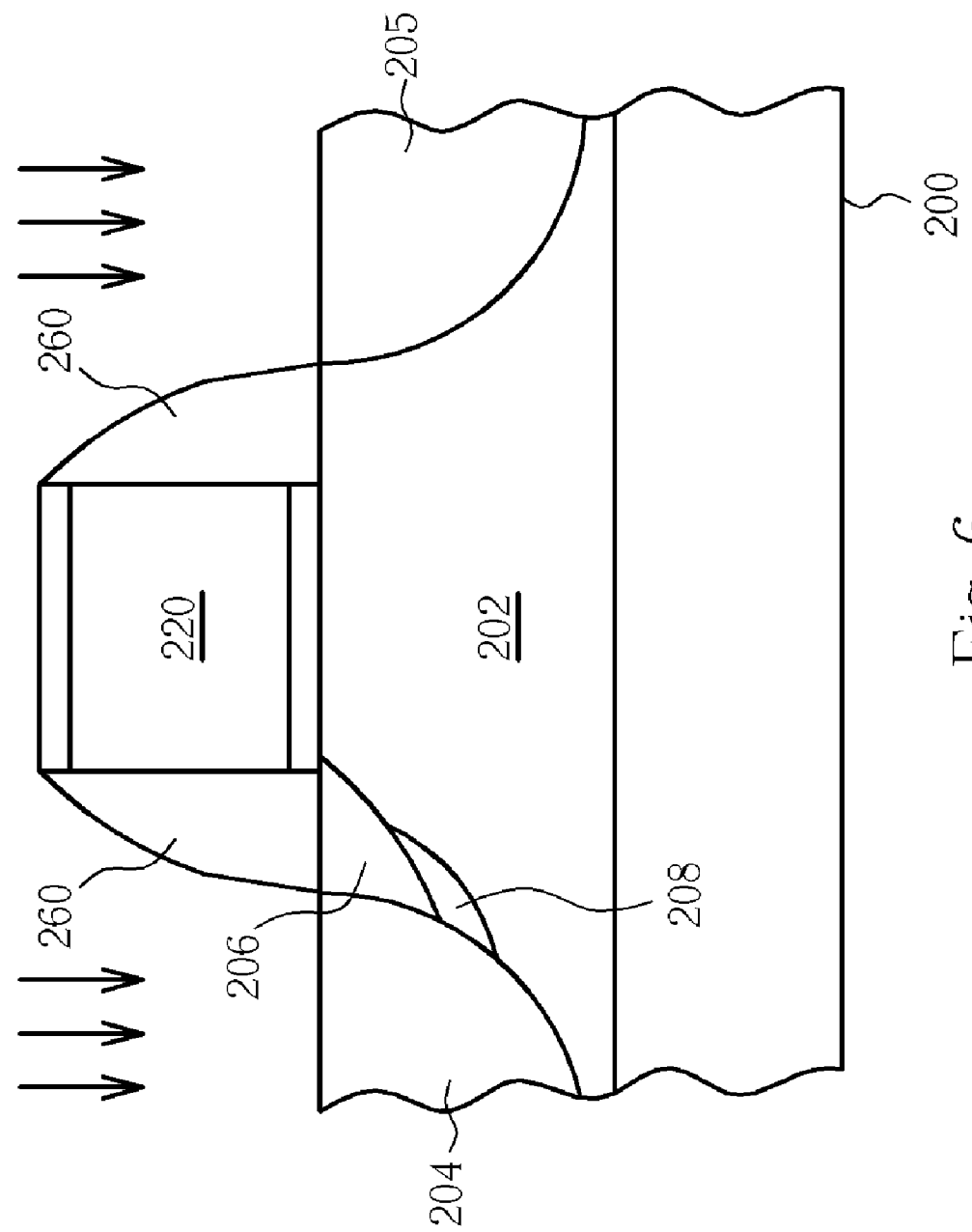

As shown in FIG. 5 and FIG. 6, the mask layer 240 is removed and spacers 260 are formed on the surfaces of the first electrode region 22 and the second electrode region 24 at the two sides of gate 220 respectively. An ion implantation process is then performed again in order to form a first doped region 204 in the first electrode region 22 and to form a second doped region 205 in the second electrode region 24. The second doped region 205 is not in contact with the channel region 20 directly, creating a separated region. Please note that for either N-type or P-type MOS transistors illustrated in this embodiment, the first doped region 204 is a source doped region when the first electrode region 22 is defined as a source region. Likewise, the second doped region 205 is a drain doped region when the second electrode region 24 is defined as a drain region. However, this is for illustrative purposes only and is not meant to be taken as a limitation of the present invention.

Figure 7:
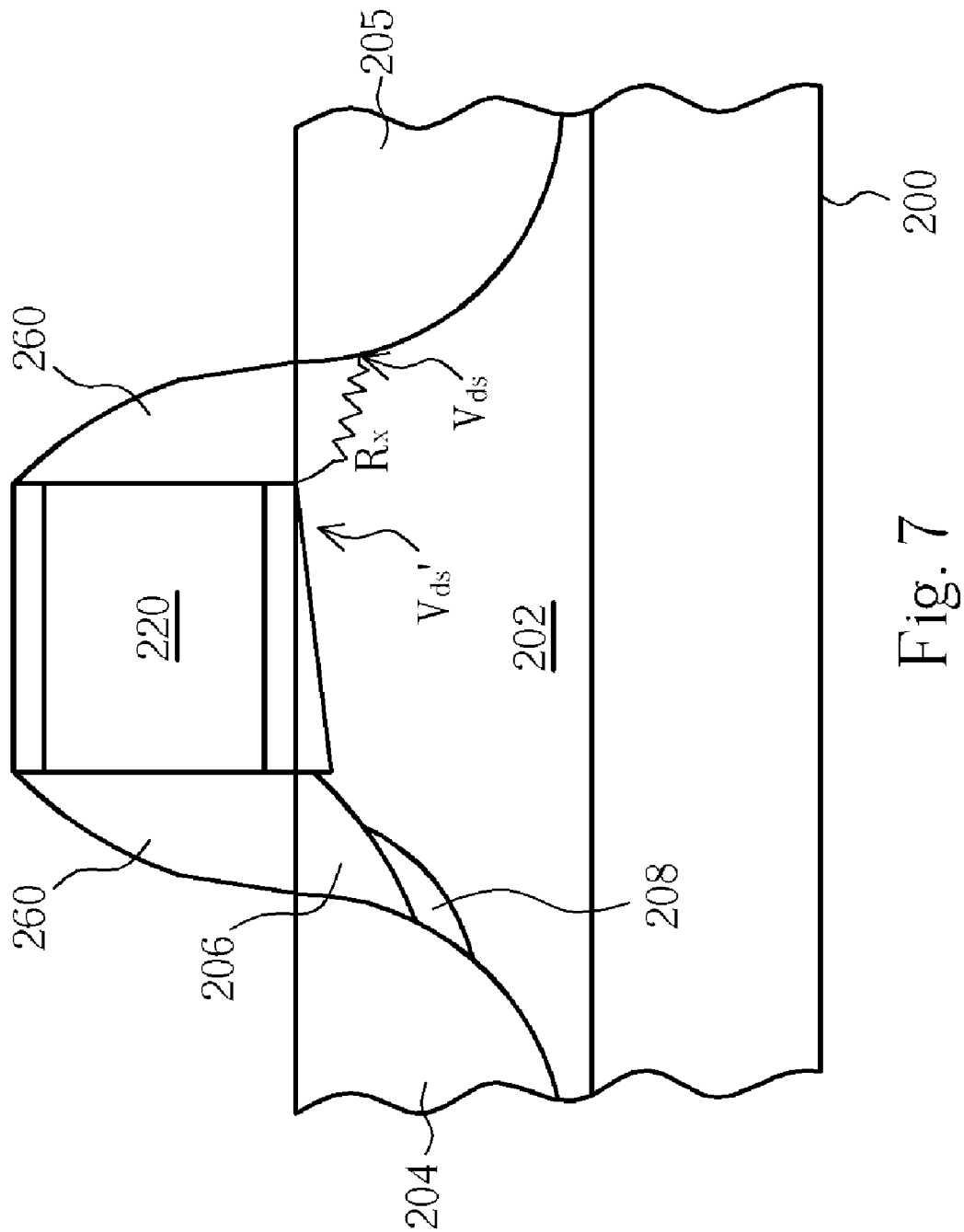
FIG. 7 is a diagram illustrating a structure of a MOS transistor according to an embodiment of the present invention.

Please refer to the structure of the MOS transistor shown in FIG. 7, which includes the substrate 200, the gate 220 and the spacers 260. The first doped region 204 and the second doped region 205 are respectively on the two sides of the gate 220 in the substrate 200 (in an embodiment of the present invention, the first doped region 204 and the second doped region 205 can be defined as a source region and a drain region respectively). The LDD 206 and the halo doped region 208 are disposed over the side of the first doped region 204 (e.g. a source region) in the substrate 200. However, at the side of the second doped region 205 (e.g. a drain region), neither does an LDD nor a halo doped region exists. When voltages are respectively applied to the source and drain of the MOS transistor for the use as a voltage-controlled resistor, a channel 210 will be induced in the channel region 20 of the MOS transistor. Since the second doped region 205 and the channel 210 do not directly contact, a series resistor Rx will be formed in the region between the second doped region 205 and the channel 210. The relationship between the drain-to-source voltage Vds and drain-to-source current Ids can be represented by the following equation:

$$Vds = Vds' + Ids*Rx \qquad (4)$$

Furthermore, the pinch off occurs in the channel 210 of the MOS transistor when the following condition is met:

$$Vds' >= Vgs - Vth \qquad (5)$$

Substituting equation (4) into equation (5) will give:

$$Vds >= (Vgs - Vth) + Id*Rx \qquad (6)$$

In light of equation (6), it can be readily understood that the drain-to-source voltage Vds required for the pinch off is increased by Id*Rx, and the resistance between the source and the drain of the MOS transistor remains constant when a larger drain-to-source voltage Vds is applied. In other words, the disclosed MOS transistor broadens the operation range of the drain-to-source voltage Vds.

Figure 1:
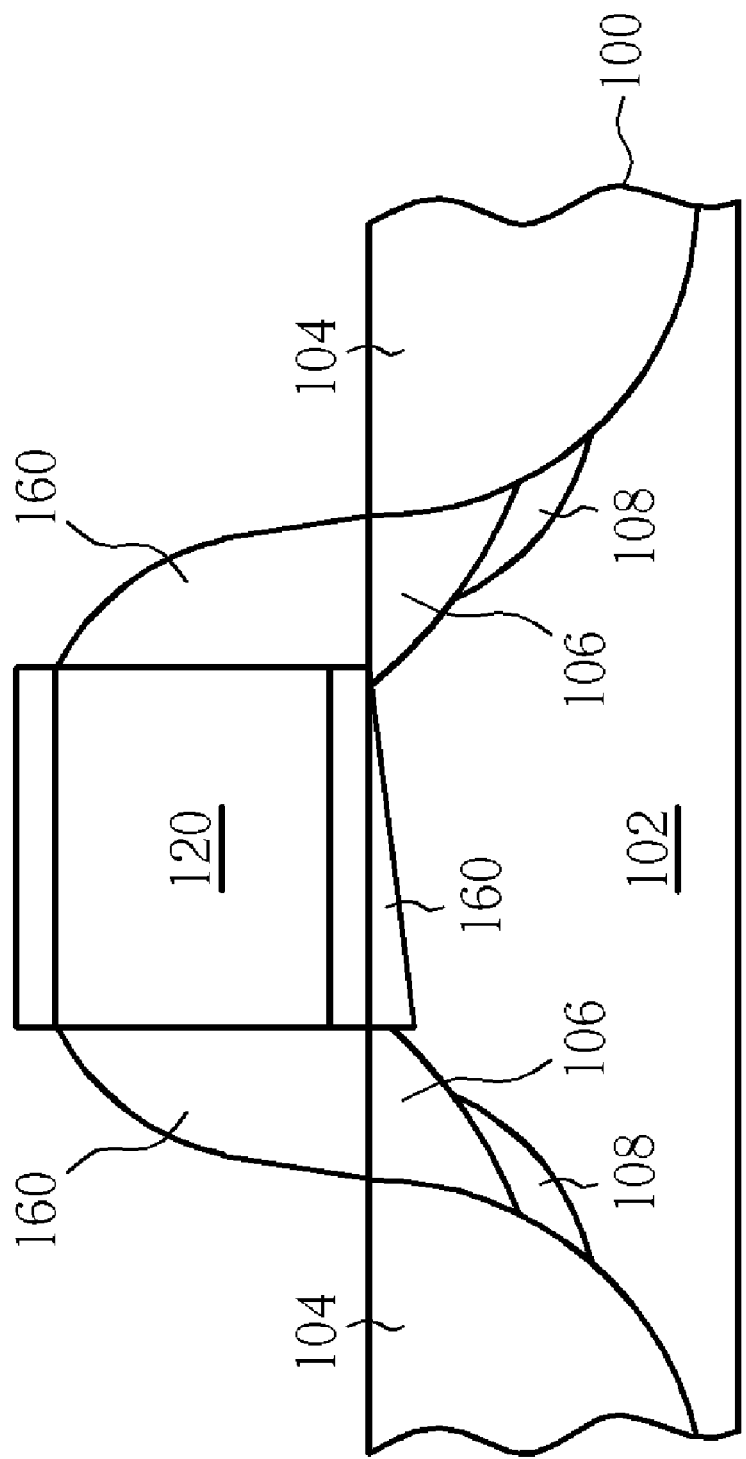
FIG. 1 is a schematic diagram illustrating a structure of an N-type MOSFET produced using a typical standard process.

As mentioned previously, the resistor linearity of the MOS transistor disclosed is better than that of a traditional MOS transistor. Furthermore, the procedure of forming a drain with no halo doping and no LDD can be easily integrated into a standard process (for example, the standard process originally in use for the manufacture of conventional MOS transistors as shown in FIG. 1). This reduces extra cost for additional photo masks.

Figure 8:
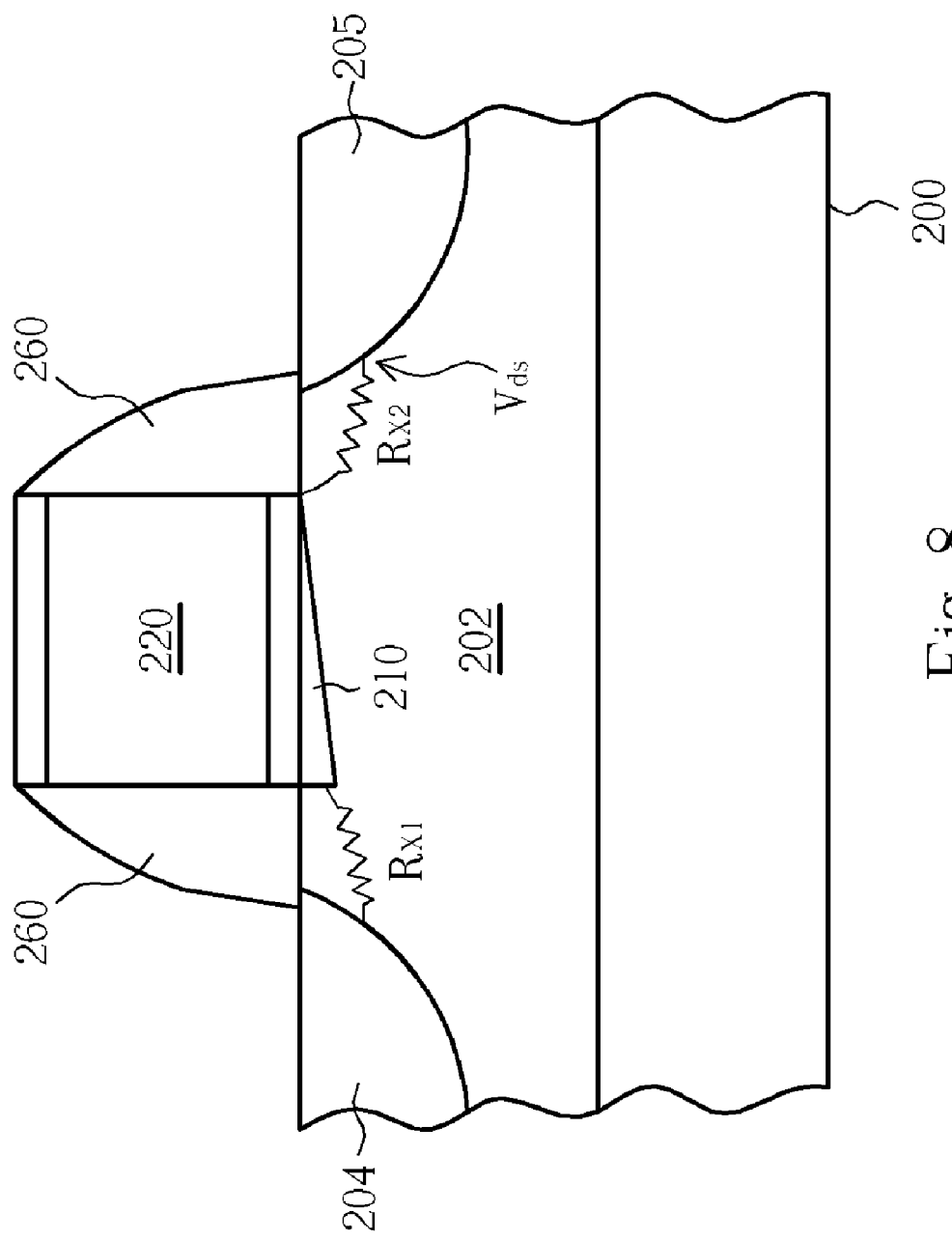
FIG. 8 is a diagram illustrating a structure of a MOS transistor according to another embodiment of the present invention.

Please refer to FIG. 8. FIG. 8 is a diagram illustrating a structure of a MOS transistor according to another embodiment of the present invention. As shown in FIG. 8, only the first doped region 204 and the second doped region 205 are formed in the substrate 200 at the two sides of the gate 220 according to the same manufacture steps mentioned above. The LDD and halo doped region that are to be seen in a typical symmetric MOS transistor are not formed. In this way, when voltages are respectively applied to the source and drain of the MOS transistor for use as a voltage-controlled resistor, the channel 210 will be induced in the channel region 20 of the MOS transistor. Since neither the first doped region 204 nor the second doped region 205 is in direct contact with the channel 210, two resistors Rx1 and Rx2 of large resistance that are coupled in series will be formed respectively in the two regions that do not directly contact with the channel 210.

Therefore, the linear operation range of the drain-to-source voltage Vds will be increased. It should be noted that the first doped region 204 and the second doped region 205 can be respectively defined either as a source and a drain or a drain and a source, depending on the circuit design requirements.

Likewise, the linearity of the MOS transistor disclosed in this embodiment is also greater than that of traditional MOS transistors. Furthermore, the ion implantation for neglecting halo doping and LDD in the drain can be easily integrated into a standard process, diminishing the need of extra photo masks.

In addition, under a process that does not comply with a standard process, an extra photo mask can be used to have both the source doped region 204 and the drain doped region 205 set within a distance from the channel region 20. This makes the distance between the channel 210 and the source doped region 204, the distance between the channel 210 and the drain doped region 205, or both distances longer than the distance fabricated using the standard process. A resistor Rx1, Rx2 or Rx1+Rx2, which is of larger resistance, is thereby formed. The linear operation range of the drain-to-source voltage Vds of the asymmetric MOS transistor disclosed will therefore differ in accordance with the resistance of different resistors in series, making the linear operation range broader and more satisfying for an individual's need.

Figure 9:
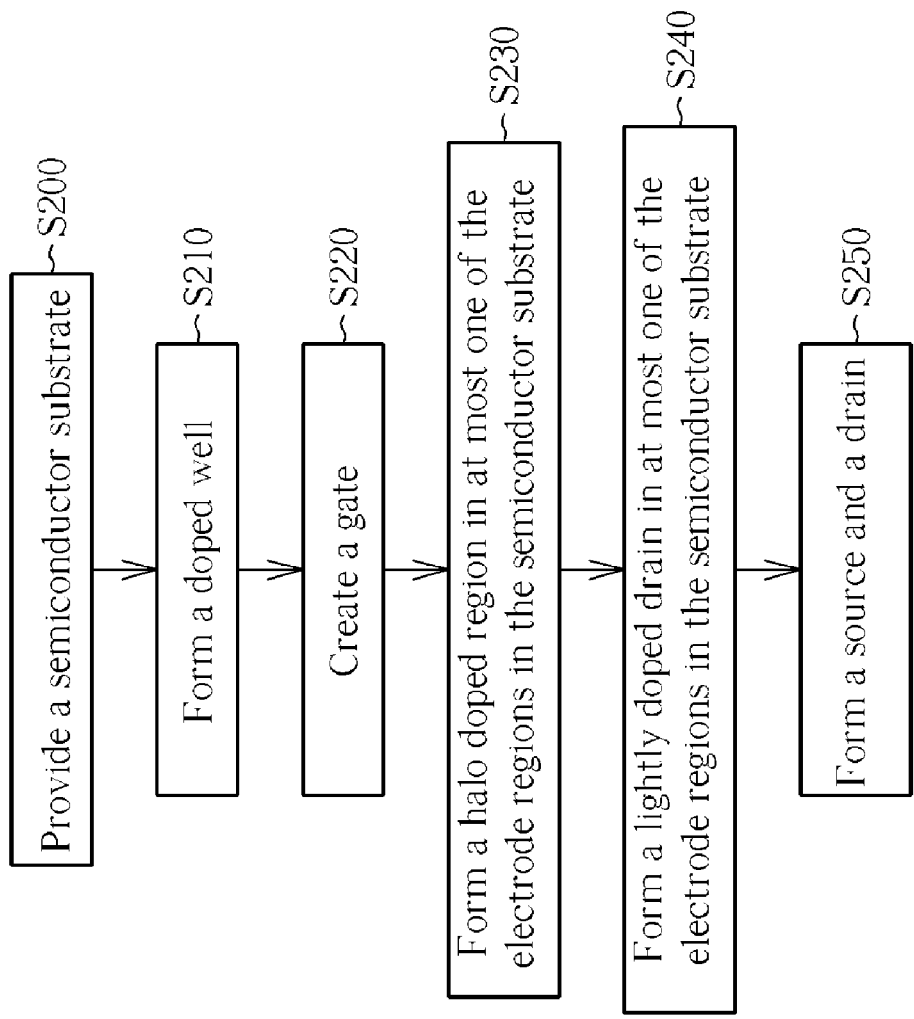
FIG. 9 is a flow chart illustrating a method for manufacturing a MOS transistor according to an embodiment of the present invention.

Please refer to FIG. 9. FIG. 9 is a flow chart illustrating a method for manufacturing a MOS transistor according to an embodiment of the present invention. The steps are as follows:

Step S200: Provide a semiconductor substrate.
Step S210: Form a doped well.
Step S220: Create a gate.
Step S230: Form a halo doped region in at most one of the electrode regions in the semiconductor substrate.
Step S240: Form a lightly doped drain in at most one of the electrode regions in the semiconductor substrate.
Step S250: Form a source and a drain.

Both the source and the drain are separated from the gate by designated regions, and at most only one of the regions will be either including the halo doped region, the LDD, or both.

In this embodiment, the step of forming the halo doped region is an optional step. That is, in another embodiment, this step can be excluded from the flow of manufacturing a MOS transistor. In practice, a standard process does not have to include the halo doped region implantation procedure.

Furthermore, in this embodiment, the distance of the region between the source/drain and the gate does not have to conform to a standard length defined in a standard process. For example, the distance can be longer than the standard length. In practice, the distance of the region between the source/drain and the gate will vary depending on the actual required resistance.

Those skilled in the art will readily observe that numerous modifications and alterations of the device and method may be made while retaining the teachings of the invention.

What is claimed is:

1. A structure of a MOS transistor, comprising:
   a gate;
   a substrate, having a channel region, a first electrode region and a second electrode region, the channel region being located below the gate, the first electrode region and the second electrode region being set at two opposite sides of the channel region respectively;
   a first doped region, set in the first electrode region; and
   a second doped region, set in the second electrode region;
   wherein the first doped region and the channel region are separated by a first separated region, the second doped region and the channel region are separated by a second separated region, and at least one of the first separated region or the second separated region is void of a lightly doped electrode, such that a lightly doped electrode exists at most in only one of the first separated region or the second separated region,
   wherein the first separated region and the second separated region do not overlap with an outer perimeter of the gate.

2. The structure of the MOS transistor of claim 1, wherein the first separated region provides a first impedance and the second separated region comprises the lightly doped electrode.

3. The structure of the MOS transistor of claim 2, wherein the second separated region further comprises a halo doped region, and the halo doped region is arranged below the lightly doped electrode.

4. The structure of the MOS transistor of claim 1, wherein the first separated region comprises the lightly doped electrode, and the second separated region provides a second impedance.

5. The structure of the MOS transistor of claim 4, wherein the first separated region further comprises a halo doped region, and the halo doped region is arranged below the lightly doped electrode.

6. The structure of the MOS transistor of claim 1, wherein the first separated region provides a first impedance, and the second separated region provides a second impedance.

7. The structure of the MOS transistor of claim 1, wherein the gate receives a gate voltage and the gate voltage makes the MOS transistor operate in a triode region.

8. The structure of the MOS transistor of claim 1, wherein the first doped region serves as a source and the second doped region serves as a drain, or the first doped region serves as a drain and the second doped region serves as a source.

9. The structure of the MOS transistor of claim 1, further comprising:
   a first spacer formed on a surface of the first separated region at one side of the gate; and
   a second spacer formed on a surface of the second separated region at an opposite side of the gate,
   wherein the first separated region overlaps with the first spacer and the second separated region overlaps with the second spacer.

10. A MOS transistor manufacturing method, comprising:
    providing a substrate having a channel region, a first electrode region and a second electrode region, the first electrode region and the second electrode region being set at two sides of the channel region respectively;
    forming a gate above the substrate, wherein the gate is located above the channel region;
    forming a first doped region in the first electrode region, wherein the first doped region and the channel region are separated by a first separated region;
    forming a second doped region in the second electrode region, wherein the second doped region and the channel region are separated by a second separated region; and
    forming a lightly doped electrode in only one of the first separated region or the second separated region, such that at least one of the first separated region or the second separated region is void of the lightly doped electrode,
    wherein the first separated region and the second separated region do not overlap with an outer perimeter of the gate.

11. The MOS transistor manufacturing method of claim 10, further comprising:
    forming a halo doped region below the lightly doped electrode.

12. The MOS transistor manufacturing method of claim 10, wherein the step of forming the lightly doped drain comprises:

modifying a photo mask with a logic operation layer to generate a modified photo mask, wherein the modified photo mask is utilized for masking at least the first separated region or the second separated region from an ion implantation to avoid forming the lightly doped drain therein.

13. The MOS transistor manufacturing method of claim 12, wherein both the photo mask and the modified photo mask are applicable to an identical standard process.

14. The MOS transistor manufacturing method of claim 10, wherein the step of forming the lightly doped drain comprises:

designing a photo mask to define the first region and the second region; and forming the first region and the second region according to the photo mask.

15. The MOS transistor manufacturing method of claim 14, wherein at least the first region or the second region is longer than a standard length defined in a standard process.

16. The MOS transistor manufacturing method of claim 10, wherein the first doped region serves as a source and the second doped region serves as a drain, or the first doped region serves as a drain and the second doped region serves as a source.

17. The MOS transistor manufacturing method of claim 10, further comprising:

forming a first spacer on a surface of the first separated region at one side of the gate; and forming a second spacer on a surface of the second separated region at an opposite side of the gate, wherein the first separated region overlaps with the first spacer and the second separated region overlaps with the second spacer.

18. A MOS transistor, serving as a voltage-controlled resistor, the MOS transistor comprising:

a gate;

a source, set at a first side of the gate; and a drain, set at a second side of the gate;

wherein the source and the gate are separated by a first separated region, the drain and the gate are separated by a second separated region, and the MOS transistor is an asymmetric MOS transistor, wherein at most only one of the first separated region or the second separated region comprises a lightly doped electrode, wherein the first separated region and the second separated region do not overlap with an outer perimeter of the gate.

19. The MOS transistor of claim 18, wherein the gate receives a gate voltage and the gate voltage makes the MOS transistor operate in a triode region.

20. The MOS transistor of claim 18, further comprising:

a first spacer formed on a surface of the first separated region at the first side of the gate; and a second spacer formed on a surface of the second separated region at the second side of the gate, wherein the first separated region overlaps with the first spacer and the second separated region overlaps with the second spacer.

* * * * *